US007224250B2

(12) United States Patent
Nemoto et al.

(10) Patent No.: US 7,224,250 B2
(45) Date of Patent: May 29, 2007

(54) SUPERCONDUCTING MAGNET APPARATUS

(75) Inventors: Kaoru Nemoto, Nagoya (JP); Motohiro Igarashi, Nagoya (JP)

(73) Assignee: Central Japan Railway, Aichi (JP)

( * ) Notice: Subject to any disclaimer, the term of this patent is extended or adjusted under 35 U.S.C. 154(b) by 93 days.

(21) Appl. No.: 10/547,789

(22) PCT Filed: Dec. 25, 2003

(86) PCT No.: PCT/JP03/16839

§ 371 (c)(1),
(2), (4) Date: Sep. 6, 2005

(87) PCT Pub. No.: WO2004/079831

PCT Pub. Date: Sep. 16, 2004

(65) Prior Publication Data

US 2006/0279387 A1 Dec. 14, 2006

(30) Foreign Application Priority Data

Mar. 6, 2003 (JP) ............................ 2003-060056

(51) Int. Cl.
*H01F 7/22* (2006.01)
*H01F 5/08* (2006.01)
*H01L 39/02* (2006.01)

(52) U.S. Cl. ........................ 335/216; 361/19; 361/141; 505/879

(58) Field of Classification Search ................ 505/211, 505/879, 902, 906; 361/19, 141; 335/216
See application file for complete search history.

(56) References Cited

FOREIGN PATENT DOCUMENTS

| | | | |
|---|---|---|---|
| JP | 59113605 A | * | 6/1984 |
| JP | 6-350148 A | | 12/1994 |
| JP | 9-51128 A | | 2/1997 |
| JP | 11-176628 A | | 7/1999 |

* cited by examiner

*Primary Examiner*—Ramon M. Barrera
(74) *Attorney, Agent, or Firm*—Sughrue Mion, PLLC

(57) ABSTRACT

This invention provides a superconducting magnet apparatus capable of preventing or restraining the heat invading into the apparatus and reducing the refrigeration load of an external refrigerator, at the time of changeover of a switch in transiting to a persistent current mode, and capable of quick changeover operation. In the superconducting magnet apparatus of the present invention (1), in transiting to a persistent current mode, a thermal superconducting switch (41) placed in a low-temperature domain and a mechanical switch (42) placed in a mid-temperature domain are turned on. Since the mechanical switch (42) is placed in the mid-temperature domain, even if a heat load is generated through the drive mechanism (60), it is not necessary to cool the mechanical switch to an extremely low temperature. In short, heat generated at the contact point of the mechanical switch (42) and heat invasion through the drive mechanism (60) are applied not to the low-temperature domain, but to the mid-temperature domain, so that an external refrigerator can easily absorb the heat load and the capacity of the refrigerator can be reduced.

7 Claims, 3 Drawing Sheets

SUPERCONDUCTING MAGNET APPARATUS

TECHNICAL FIELD

This invention relates to a superconducting magnet apparatus that switches itself into a persistent current mode by changeover of switches after excitation.

BACKGROUND ART

Along with improvements in performance of the superconducting wires and advances in coil manufacturing techniques using such wires, as well as technical developments in related apparatuses such as heat-insulating containers and refrigerators, various types of superconducting magnets and application apparatuses employing such magnets have been created. Among these, there is a type which is operated in a persistent current mode. Superconducting magnet apparatuses for magnetic resonance imaging systems (MRI) and for magnetically levitated vehicles (Maglev) are examples of this type which have already been put into practical use. These superconducting magnet apparatuses supply an electric current from an external excitation power source to a coil that is cooled to an extremely low temperature. While a required magnetic field is produced, winding start and end portions of the coil are shunted by a superconducting switch, and this makes the apparatus run in a persistent current mode in which the electric current continues to flow into the coil without a power supply. FIG. 5 shows an example of an excitation circuit in these conventional superconducting magnet apparatuses.

As shown in FIG. 5, superconducting switch 140 is connected to each end of the winding start portion and the winding end portion of a superconducting coil 110 in a conventional superconducting magnet apparatus 101 and the superconducting coil 110 is placed in an extremely low-temperature area (about 4.2K) inside the superconducting magnet apparatus 101. A normal conducting current lead 132 having a low thermal conductivity is also connected to each end of this superconducting coil 110. The other end of this normal conducting current lead 132 extending to the outer surface of the superconducting magnet apparatus 101 is connected to an external excitation power source 151 in a normal-temperature domain (about 300K).

Conventionally, a thermal superconducting switch, whose resistance is zero when it is on and which has a simple structure, has been mainly used as an aforementioned superconducting switch 140. However, a mechanical superconducting switch, and a superconducting switch comprising a thermal superconducting switch 141 and a mechanical superconducting switch 142 connected in parallel as shown in FIG. 5, have been proposed (see patent document 1 and non-patent document 1, for example).

Patent Document 1
Unexamined Japanese Patent Publication No. 6-350148

Non-Patent Document 1
"Handbook of Research and Development of Superconductivity", International Superconductivity Technology Center, published by Ohmsha, Ltd., P 160–163, (1991)

However, conventional superconducting magnet apparatuses have the following problems, when each superconducting switch is adopted in the excitation circuit.

In the case of using a thermal superconducting switch alone, there is a disadvantage that it takes time to cool or to heat between ON-state (superconducting state) and OFF-state (normal conduction state). In other words, it takes time to change from ON-state to OFF-state and vice versa, since it utilizes thermal phenomena. Especially in the case of using superconducting coils having a high superconducting critical temperature and also employing a material having a high superconducting critical temperature for a superconducting switch in order to keep the superconducting state in the persistent current mode, it takes a longer time to change from the ON-state to the OFF-state and vice versa, since the temperature difference between ON-state and OFF-state is larger and the thermal capacity is larger. As a consequence, during excitation when the superconducting magnet apparatus is switched into the persistent current mode, the energized time of the current lead becomes longer and the Joule heat increases, thus causing a problem of an increase in the load of an external refrigerator which cools inside of the superconducting magnet apparatus.

In the case of employing a mechanical superconducting switch alone, it is possible to turn it on and off instantly, but it is difficult to decrease contact resistance sufficiently in an ON-state, so the contact resistance causes problems such as current decay and heat generation when the switch is connected to the superconducting coil. Furthermore, there is a disadvantage in that considerable invasion heat from the drive mechanism that drives the contact in a contact or non-contact state increases heat load of the superconducting coil.

As shown in FIG. 5, in the case of connecting a thermal superconducting switch and a mechanical superconducting switch in parallel, as in the case of employing a mechanical superconducting switch alone, there is the same disadvantage that invasion heat from the drive mechanism that drives the contact increases the heat load of the superconducting coil. There also is a problem that the contact resistance of the mechanical superconducting switch causes heat generation until the thermal superconducting switch has completed switching when turned on.

One object of the present invention, which was made in view of the above problems, is to provide a superconducting magnet apparatus capable of preventing or controlling heat invasion into the inside of the apparatus at the time of changeover of the switching, thereby reducing the cooling load of the external refrigerator, and capable of quick changeover operation.

DISCLOSURE OF THE INVENTION

In order to reach the above object, a superconducting magnet apparatus set forth in claim 1 is comprised of a vacuum container including an inner tank forming therein a low-temperature domain and housing a superconducting coil, a heat shield covering the inner tank and forming therein a mid-temperature domain, with a temperature higher than in the low-temperature domain, and an outer tank containing the heat shield so as to separate the heat shield from the ambient air and forming a normal-temperature domain with a temperature higher than in the mid-temperature domain; a current lead connected at one end to the superconducting coil, and connected at the other end to a lead line leading to an external excitation power source provided outside the vacuum container; a switch turned on and off in order to shunt or open both ends of the superconducting coil; and a switching device that turns on and off the switch.

The "low-temperature domain" means a so-called extremely low-temperature domain with almost the same temperature as the cooling temperature of the superconducting coil; the "normal-temperature domain" means a temperature domain with almost the same temperature as the room temperature; and "mid-temperature domain" means a temperature domain with a temperature higher than the temperature in the low-temperature domain and lower than the critical temperature of the superconducting current lead.

"Thermal shield" means a shield which is called an irradiation shield a radiation shield or a thermal shield.

The "low-temperature domain", as mentioned above, is the domain which is cooled to an extremely low temperature, and there are several cooling systems, such as, one in which a cooling medium like liquid helium is supplied to the inside of the inner tank from an external refrigerator, and another in which cooling is created by heat conduction from the external refrigerator. In a similar fashion, as regards "mid-temperature domain", there are several cooling systems such as one for cooling by supplying a cooling medium like liquid nitrogen from the external refrigerator and another for cooling by heat conduction from the external refrigerator.

The superconducting apparatus is switched to a persistent current mode by supplying an electric current to the superconducting coil from the external excitation power source through the current lead under a condition that the switch is off, thereby causing the superconducting coil to generate a necessary magnetic field, and then shunting both ends of the superconducting coil by turning on the switch.

Specifically, the current lead includes a first current lead connected at one end to one end of the superconducting coil in the low-temperature domain and a second current lead connected at one end to the other end of the first current lead in the mid-temperature domain and connected at the other end to the lead line in the normal-temperature domain, at least the first current lead including the superconducting current lead which becomes a superconducting state in the mid-temperature domain.

Also, the switch includes a thermal superconducting switch connected to the both ends of the superconducting coil to shunt the superconducting coil in the low-temperature domain and a mechanical switch connected to the both ends of the first current lead in parallel to the thermal superconducting switch and able to shunt the superconducting coil in the mid-temperature domain. In other words, while the thermal switch (the superconducting switch) disposed in the low-temperature domain includes a superconducting switch which is switched to a persistent current mode, the mechanical switch disposed in the mid-temperature domain may be either a superconducting switch or a normal-conducting switch.

The mechanical switch is turned on and off through a driving mechanism disposed in the mid-temperature domain and driven by the switching device.

The term "thermal superconducting switch" means a switch that is turned off by electrical resistance caused by transition to the normal conducting state when it is heated by a heating device, such as a heater; and "mechanical switch" means a switch which is turned on by a mechanical structure.

According to the above configuration, when the switch is turned on to switch into a persistent current mode in an excited state, it takes a certain amount of time to complete the switching process since the thermal superconducting switch uses the thermal phenomena, but the output current of the external power source can be attenuated (shut off) immediately by the instant switching of the mechanical switch. As a consequence, since the current-carrying time of the current lead is shortened and the heat generation is reduced, the load of the refrigerator that cools the current lead can be reduced.

In the case of using the above configuration, since the mechanical switch is placed in the mid-temperature domain, even if a heat load is generated through the drive mechanism, it is not necessary to cool the mechanical switch to an extremely low temperature. In short, heat generated at the contact point of the mechanical switch and heat invasion through the drive mechanism are applied not to the low-temperature domain, but to the mid-temperature domain, so that the external refrigerator can easily absorb the heat load. As a consequence, the capacity of the refrigerator can be reduced compared with the conventional case of placing a mechanical switch in the low-temperature domain.

When the aforementioned second current lead is a normal conducting current lead, which is made of a normal conducting material, the superconducting magnet apparatus can be produced at a lower cost than when the second current lead is made of a superconducting material. However, a part or all of the second current lead may be a superconducting current lead that is made of a superconducting material.

Additionally, a mechanical switch does not necessarily need to be made of a superconducting material, since heat load through the mechanical switch is allowed to some extent.

Therefore, as set forth in claim 2, if a normal conducting switch, which is made of a normal conducting material, constitutes the above mechanical switch, a superconducting magnetic apparatus can be produced at a lower cost.

In addition, as mentioned above, even if a normal conducting material that is less expensive than a superconducting material constitutes the second current lead and the mechanical switch, the load to the external refrigerator cannot be reduced while maintaining the inherent functions as a superconducting magnet apparatus without applying the configuration mentioned in claim 1, which effectively utilizes the mid-temperature domain.

After the thermal superconducting switch reaches the given superconducting state and transition to a persistent current mode is completed, the mechanical switch may be kept on by the drive mechanism as well as the thermal superconducting switch.

In the above configuration, if some sort of thermal agitation is applied to the thermal superconducting switch in the persistent current mode to cause temporary transfer to the normal conducting state, the superconducting coil can keep the excitation state since the current makes a detour thorough the mechanical switch. In short, the mechanical switch will not be turned off by thermal agitation, while the thermal superconducting switch returns to the superconducting state when the thermal agitation is removed. Therefore, stabilized current-carrying in order to return to the persistent current mode can be achieved.

In the situation in which the current-carrying of the thermal superconducting switch can be fully stabilized in relation to the thermal agitation, and transition to a normal conducting state is impossible, as set forth in claim 3, the aforementioned switching device turns on the mechanical switch and the thermal superconducting switch at the start of switching into a persistent current mode and turns off the mechanical switch when the thermal superconducting switch reaches the given superconducting state.

By the above configuration, in the case in which the drive mechanism continues applying the driving force in order to keep the mechanical switch on and the drive mechanism generates power loss, in other words, heat, the drive mechanism stops generating heat by turning off the mechanical switch and the load of the external refrigerator that cools the mid-temperature domain where those switch and mechanism are placed can be reduced more.

As set forth in claim 4, the above drive mechanism may be a mechanism using a normal conducting solenoid that generates electromagnetic force by the interaction with the magnetic field which the superconducting coil generates, and turning on and off the mechanical switch by closing or opening of the contact of the mechanical switch by the electromagnetic force. An example of this mechanism is shown as an embodiment hereinafter described.

According to the above constitution, by using effectively the magnetic field that superconducting coil generates and by a simple constitution, the mechanical switch can be switched.

Alternatively, as set forth in claim 5, the drive mechanism may be a mechanism using a piezoelectric element, and turning on and off the mechanical switch by closing or opening the contact of the mechanical switch by energization or deenergization of the piezoelectric element.

Specifically, the drive mechanism may be designed to move back and forth by an extension/contraction action of the piezoelectric element, such as a piezoelectric ceramic, which extends in response to a voltage applied and is made to extend/contract by energization control, and thereby to close or open the mechanical switch.

The above piezoelectric element is less influenced by a magnetic field, so the magnetic field distribution in the superconducting magnetic apparatus doesn't restrict the arrangement of the piezoelectric element. Also, even when the magnetic field is changed by, for example, changing the magnetomotive force of the superconducting coil, the mechanical switch may be driven reliably.

Alternatively, as set forth in claim 6, the drive mechanism may be a slide mechanism including an ultrasonic motor using a piezoelectric ceramic.

When the power supply is stopped, the above ultrasonic motor stops, while maintaining the state at the point. Thus, when the power supply is stopped while the mechanical switch is on, the mechanical switch is kept in an ON-state. When the mechanical switch should be kept in an ON-state in order to prevent the thermal superconducting switch from transiting to a normal conducting state in accordance with the above described constitution, this provides a power-saving feature since power supply doesn't need to be continued in order to keep the ON-state.

BEST MODE FOR CARRYING OUT THE INVENTION

Preferred embodiments of the present invention will now be described for further clarification of the mode for carrying out the invention, with reference to the accompanying drawings.

First Embodiment

Figure 1:
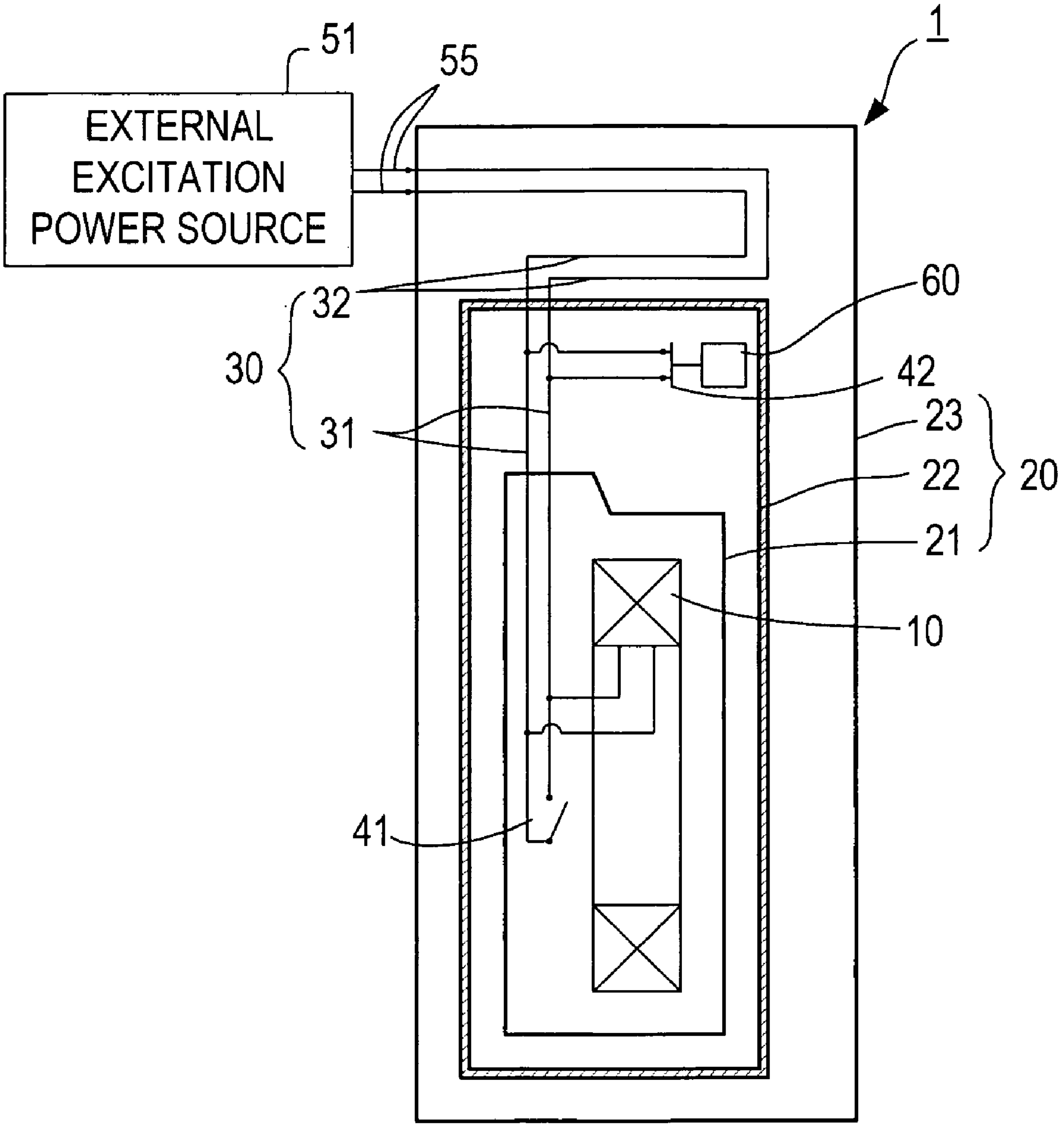
FIG. 1 is an explanatory view showing a schematic constitution of a superconducting magnet apparatus according to a first embodiment of the present invention.
Figure 2:
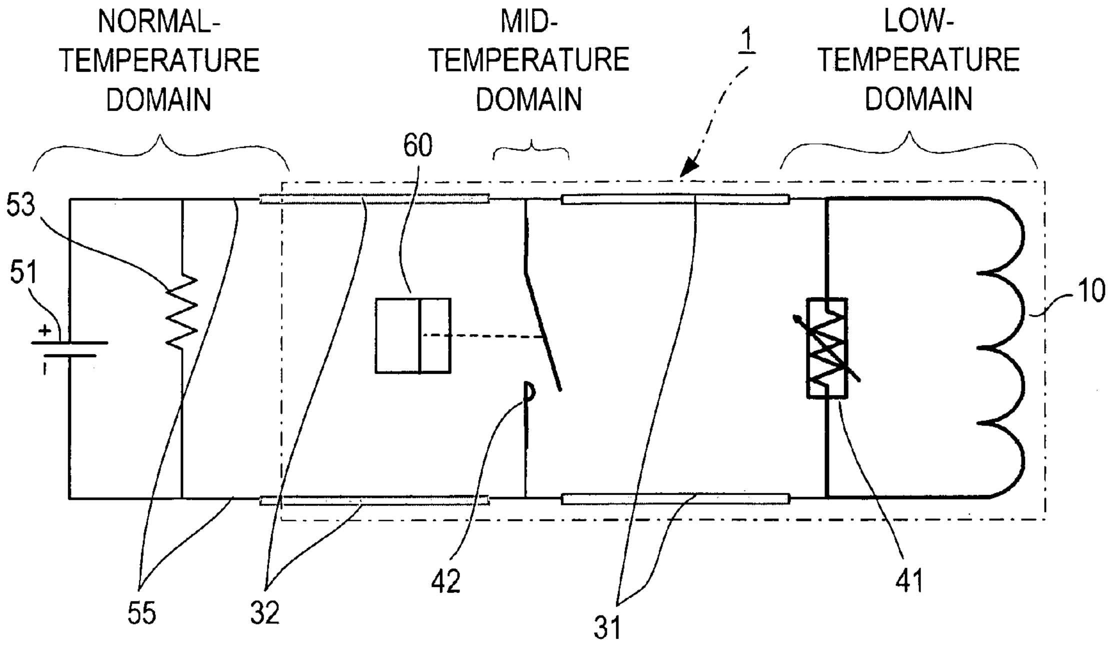
FIG. 2 is an explanatory view showing an electric constitution of a superconducting magnet apparatus according to the first embodiment.

The present embodiment describes a superconducting magnet apparatus for Maglev according to the present invention. FIG. 1 is an explanatory view (cross sectional view) showing a schematic constitution of the superconducting magnet apparatus. FIG. 2 is an explanatory view showing a schematic electric constitution of the superconducting magnet apparatus.

As shown in FIG. 1, the superconducting magnet apparatus 1 of the present embodiment comprises a vacuum container 20 housing a superconducting coil 10 inside the vacuum container 20, and a current lead 30 placed in the vacuum container 20 for supplying an electric current to the superconducting coil 10 from an external excitation power source 51.

The vacuum container 20 comprises an inner tank 21 in which a low-temperature domain is formed and the superconducting coil 10 is placed, a heat shield 22 covering the inner tank 21 in which a mid-temperature domain whose temperature is higher than the low-temperature domain is formed, and an outer tank 23 in which the heat shield 22 is contained so as to be separated from the ambient air and a high-temperature domain is formed, whose temperature is higher than the mid-temperature domain.

In this embodiment, since an NbTi superconducting alloy wire is employed as the superconducting coil 10, the above "low-temperature domain" is set to about 5K or below. In the case that a superconducting wire whose temperature dependence of critical current is different from NbTi, for example, $Nb_3Sn$ superconducting wire is employed, the above "low-temperature domain" may be set to about 15K or below and in the case that a Bi-system superconducting wire is applied, it may be set to about 60K or below. Moreover, as described later, if this embodiment employs a high-temperature superconducting current lead of a Y-system superconducting wire whose critical temperature is about 90K as part of the current lead 30, the "mid-temperature domain" is set to about 80K or below. The "normal-temperature domain" is a temperature domain with a temperature of about 300K which is the same as the temperature of the outer tank, in other words the room temperature.

The inner tank 21 is filled with liquid helium in order to cool the superconducting coil 10 at an extremely low temperature (about 4.2K) and the liquid helium can be accordingly supplied from an external refrigerator (not shown). Liquid nitrogen supplied from the external refrigerator cools the heat shield 22 to a mid-temperature (about 80K). Therefore, that can reduce radiation heat (heat invasion) from the outer tank 23, which forms the normal-temperature domain (about 300K), to the inner tank 21, which forms the low-temperature domain.

The current lead 30 is connected to the superconducting coil 10 at one end, and at the other end it is connected to a lead line 55 leading to the external excitation power source 51 provided outside the vacuum container 20. This current lead 30 is composed of a first current lead 31, which is a high temperature superconducting current lead consisting of the aforementioned Y-system superconducting wire which becomes superconducting at the mid-temperature domain, and a second current lead 32, which is a normal conducting current lead consisting of normal conducting metal such as copper and brass.

The first current lead 31 is connected at one end to one end of the superconducting coil 10 in the low-temperature domain. On the other hand, the second current lead 32 is connected at one end to the other end of the first current lead 31 in the mid-temperature domain and connected at the other end to the lead line 55 outside of the vacuum container. Therefore, the first current lead 31 has a thermal gradient from an approximate extremely low temperature (about 4.2K) near the inner tank 21 and an approximate mid-temperature (about 80K) near the heat shield 22. Transition to a superconducting state is reached at a temperature of about 80K or below. In addition, the second current lead 32 has a thermal gradient from an approximate mid-temperature (about 80K) near the heat shield 22 to an approximate normal temperature (about 300K) near the outer tank 23.

A thermal superconducting switch 41, which is connected to both ends of the superconducting coil 10 and shunts it, is disposed in the low-temperature domain, and a mechanical switch 42, which is connected to both ends of the first current lead 31 in parallel to the thermal superconducting switch 41 and is able to shunt the superconducting coil 10, is disposed in the mid-temperature domain.

When heating means, such as a heater, stops heating the thermal superconducting switch 41, the thermal superconducting switch 41 is cooled, and transits to the superconducting state with a zero resistance, and thus is completely turned on. On the other hand, a drive mechanism 60 disposed in the mid-temperature domain turns the mechanical switch 42 on and off. A not-shown control unit (switch means) disposed outside of the superconducting magnetic apparatus 1 controls the current to the heating means, such as the aforementioned heater, and controls the driving current supply to the driving mechanism 60.

Figure 3:
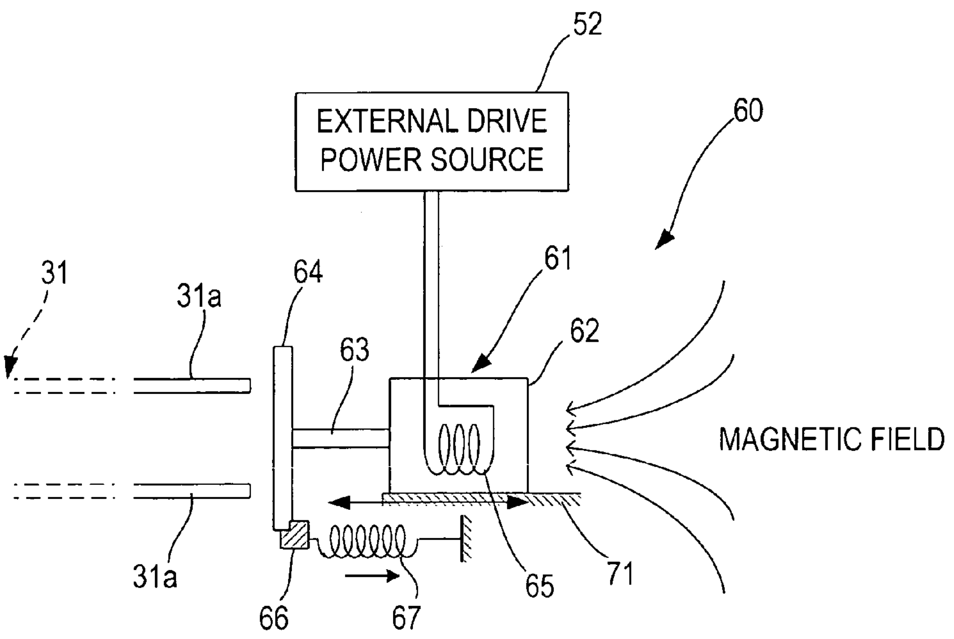
FIG. 3 is an explanatory view showing a schematic constitution of a drive mechanism which composes the superconducting magnet apparatus of the first embodiment.

FIG. 3 shows a schematic configuration of the driving mechanism 60. The driving mechanism 60 is comprised of a short-circuit member 61 disposed along a guide member 71 in a base portion extending from a casing (not shown) of the vacuum container 20 and disposed so that it can be moved back and forth in the approaching or separating direction to or from the first current lead 31. The short-circuit member 61 is comprised of a body member 62, which slides guided by the guide member 71, an elongated support member 63 disposed to extend from the middle of the surface of the body member 62 on the side of the first current lead 31 toward the first current lead 31, and a plate-like contact member 64 connected to the end of the support member 63. A normal conducting solenoid 65 is disposed inside of the body member 62 and an end of a coil spring 67 is connected to the outside edge of the contact member 64 through a connection member 66. The coil spring 67 with the other end fixed to the base member biases the contact member 64 in a direction opposite to the first current lead 31. On the other hand, respective contact buttons 31*a*, 31*a*, extend from respective ends of a pair of the first current leads 31 toward the side of the driving mechanism 60.

Therefore, when the superconducting coil generates a magnetic field due to excitation, and the external drive power source 52 supplies current to the normal conducting solenoid 65, the normal conducting solenoid 65 generates a magnetic force by interaction with the magnetic field generated by the superconducting coil 10. This magnetic force moves the body member 62 towards the first current lead 31 against the biasing force of the coil spring 67. After that, the contact member 64 contacts both of the contact buttons 31*a*, 31*a* and accordingly shunts the superconducting coil 10. In this case, when the external drive power source 52 stops supplying current, the aforementioned magnetic force extinguishes and the body member 62 moves back, and then the superconducting coil 10 is freed from the short-circuited state.

According to the superconducting magnet apparatus of the present embodiment explained above, in transiting to the persistent current mode, the thermal superconducting switch 41 and the mechanical switch 42 are turned off, and then the external excitation power source 51 supplies current to the superconducting coil 10 through the second current lead 32 and the first current lead 31. After a required magnetic field is generated around the superconducting coil 10, these switches are turned on, and the both ends of the superconducting coil 10 are short circuited.

In this case, while the thermal superconducting switch 41 utilizing thermal phenomena requires a certain amount of time to complete switching, the mechanical switch can be turned on and off at once, then the output current of the external excitation power source 51 can be either cut off or decayed. This results in a decrease in the energization time for both current leads. Thus, heat generation in the leads decreases, and then the load of the external refrigerator which cools them decreases.

If the thermal superconducting switch 41 temporarily transits to the normal conducting state in the persistent current mode because of thermal agitation, the superconducting coil 10 can keep the excitation state while the mechanical switch 42 is on and the current bypasses to the mechanical switch 42. In other words, since the mechanical switch 42 is not turned off due to thermal agitation, and the thermal superconducting switch 41 returns to the superconducting state when the thermal agitation is removed, stabilized energization can be achieved to return to the persistent current mode.

In the superconducting magnet apparatus of the present embodiment, since the mechanical switch 42 is disposed in the mid-temperature domain, even if the heat load is generated through the driving mechanism 60, it is unnecessary to cool the mechanical switch 42 to an extremely low temperature. In other words, heat generation at the contact of the mechanical switch 42 and heat invasion from the driving mechanism 60 are loaded not into the low-temperature domain but into the mid-temperature domain, and the external refrigerator can easily absorb the heat load. Therefore, the refrigerator capacity is less than that in the case of disposing the mechanical switch 42 in the low-temperature domain in a conventional manner.

In addition, since the superconducting coil 10 and the mechanical switch 42 are connected through the first current lead 31, which transits to the superconducting state at mid-temperature, if the mechanical switch 42 is turned on during switching into the persistent current mode, decay of the current from the superconducting coil 10 can be prevented or be restrained, and the switching into the persistent current mode can be completed smoothly.

Furthermore, in this embodiment, in which the mechanical switch 42 is disposed in the mid-temperature domain, the heat load can be permitted more than in the case of disposing it in the low-temperature domain, as mentioned above. Therefore, as mentioned above, the mechanical switch 42 can consist of inexpensive normal conducting material. Also, the second current lead 32 can consist of inexpensive normal conducting material.

As a consequence, the superconducting magnetic apparatus can be produced at a cheaper price, while keeping its primary performance.

As well, in this embodiment, the first current lead 31 is a high-temperature superconducting current lead made of a Y-system superconductor, but the Y-system superconductor may be replaced by a means which switches into the superconducting state at a temperature lower than the mid-temperature. Thus, for example, a Bi-system high-temperature superconducting current lead or Tl-system high-temperature superconducting current lead may be employed.

Second Embodiment

Figure 4:
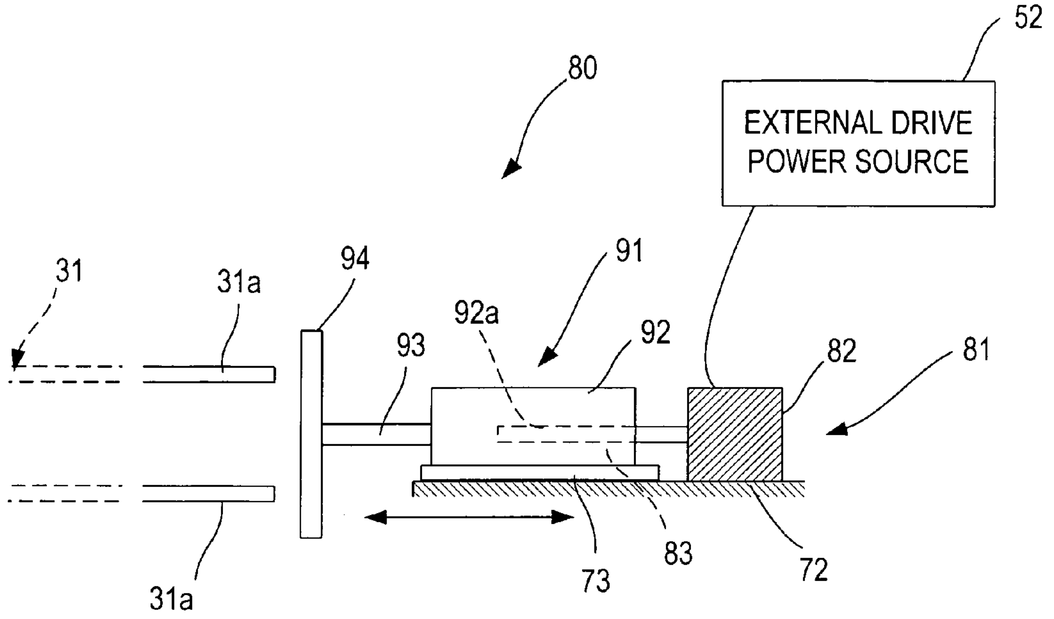
FIG. 4 is an explanatory view showing a schematic constitution of a drive mechanism which composes a superconducting magnet apparatus of a second embodiment.
Figure 5:
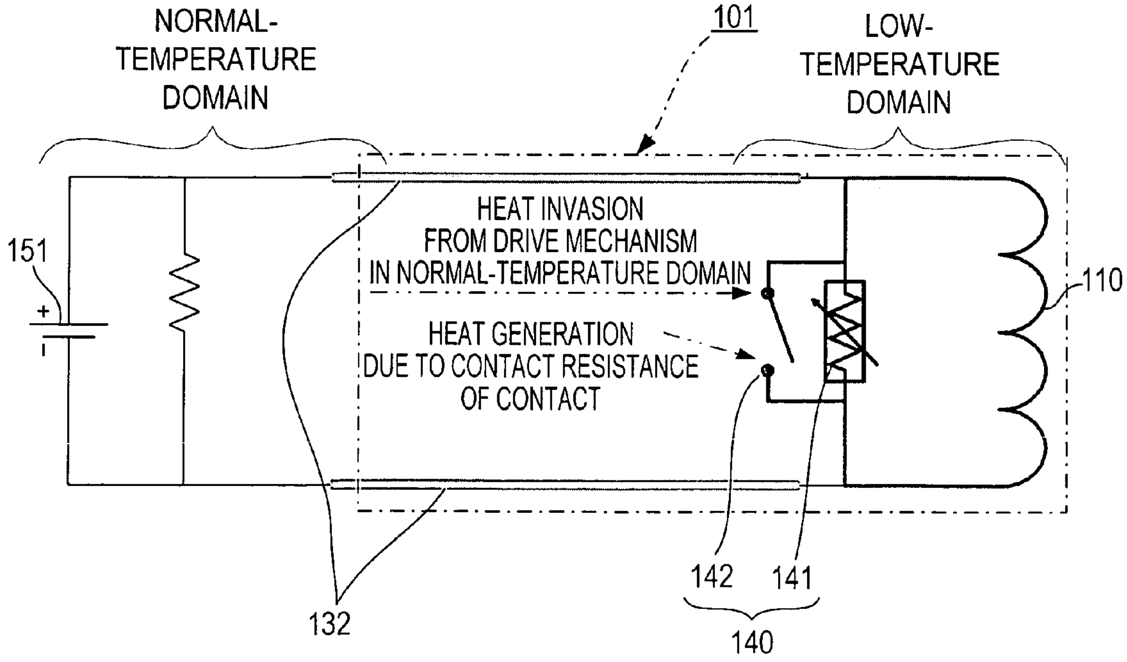
FIG. 5 is an explanatory view showing an electric constitution of a conventional superconducting magnet apparatus and its problems.

In the above first embodiment, the driving mechanism 60 utilizing the normal conducting solenoid 65 is employed as a driving mechanism to turn on and off the mechanical switch 42. The present embodiment employs a driving mechanism that is different from the first embodiment. FIG. 4 is a schematic view of the driving mechanism, which corresponds to FIG. 3 in the first embodiment. The basic constitution of the present superconducting magnet apparatus, the manner of supplying electric power, etc. are substantially identical in principle with those in the first embodiment. Therefore, the identical components are numbered the same and an explanation thereof is not repeated.

As shown in FIG. 4, a driving mechanism 80 in this embodiment comprises a slide mechanism 81 that performs sliding movement by applying a given voltage to an ultrasonic motor from the external drive power source 52 to drive the same.

The slide mechanism 81 comprises an ultrasonic motor 82 including piezoelectric ceramic and fixed on a base member 72, which is provided on the casing (not shown) of the vacuum container 20, a ball screw 83 connected to a rotation axis of the ultrasonic motor 82 and extending in the axial direction, and a short-circuit member 91 driven by rotation of the ball screw 83 and moving back and forth in the direction of the first current lead 31.

The short-circuit member 91 comprises a body member 92, which slides guided by a guide member 73 on the base member 72, a longitudinal support member 93 disposed to extend from the middle of the surface of the body member 92 on the side of the first current lead 31, and a plate-like contact member 94 connected to the end of the support member 93. A screw hole 92*a* is provided, along the axis of the ball screw 83 in the body member 92. A female screw, which engages the screw thread of the ball screw 83, is formed in the screw hole 92*a*.

In switching into the persistent current mode, a voltage is first supplied to the drive mechanism 80 from the external drive power source 52, and the ultrasonic motor 82 is driven to rotate the ball screw 83. As a result, the body member 92 slides, guided by the guide member 73, and moves toward the first current lead 31, and then the contact member 94 comes into contact with contact buttons 31*a*, 31*a* and finally shunts the superconducting coil 10.

After the switching to the persistent current mode is completed, the contact member 94 may be retreated to release the superconducting coil 10 from the shunt state by starting the voltage supply from the external drive power source 52 and driving the ultrasonic motor 82 in reverse to the above. Alternatively, after the switching to the persistent current mode is completed, the superconducting coil 10 may be kept in the short-circuit state by stopping the voltage supply from the external drive power source 52.

As mentioned above, when the power supply is stopped, the ultrasonic motor 82 stops maintaining the state at the point. On this account, when the power supply is stopped while keeping the mechanical switch 42 on, the ON-state may be maintained. This is advantageous, in view of power-saving, to the above described configuration, in which the mechanical switch is kept in the ON-state in order to prevent the thermal superconducting switch 41 from transiting to the normal conducting state, since it is unnecessary to keep supplying current in order to keep the ON-state.

Moreover, since the ultrasonic motor 82 comprising a piezoelectric ceramic (piezoelectric element) is employed therein, the driving mechanism 80 is less affected by the magnetic field, so that the magnetic field distribution in the superconducting magnetic apparatus will not restrict the arrangement of the driving mechanism 80. Even if the magnetic field changes, for example, by changing the magnetomotive force of the superconducting coil 10, the mechanical switch 42 can certainly be driven.

The embodiments of the present invention have been described in the above. However, embodiments of the present invention should not be limited to the above embodiments, and other variations might be possible without departing from the technical scope of the invention.

In the above second embodiment, the ultrasonic motor, comprising a piezoelectric ceramic, is described as the driving mechanism comprising a piezoelectric element. The piezoelectric element, such as piezoelectric ceramic, extends when voltage is applied. The contact of the mechanical switch 42 may be designed to be closed or opened by moving the driving mechanism back and forth, utilizing extension/contraction of the piezoelectric element by energization control. As the piezoelectric element, piezoelectric single crystal and piezoelectric organic matter may be employed, other than the piezoelectric element.

In the above embodiments, for instance, the second current lead 32 and the mechanical switch 42 are composed of an inexpensive normal conducting material. However, these may surely be composed of a superconducting material.

Moreover, in the above embodiments, as a cooling system for the low-temperature domain in the inner tank 21, the external refrigerator supplies a cooling medium, such as liquid helium, into the inner tank in order to cool the low-temperature domain. However, it may be cooled by thermal conduction from the external refrigerator. In a similar way, the external refrigerator supplies a cooling medium, such as liquid nitrogen, as a cooling system for the mid-temperature domain of the heat shield 22. However, it may be cooled by thermal conduction from the external refrigerator.

INDUSTRIAL AVAILABILITY

According to this invention, it is possible to provide a superconducting magnet apparatus, for example, a superconducting magnet apparatus for Maglev, capable of preventing or restraining the amount of the heat invading into the apparatus and reducing the refrigeration load of an external refrigerator, at the time of changeover of a switch, and capable of quick changeover operation.

The invention claimed is:

1. A superconducting magnet apparatus comprising:

a vacuum container including an inner tank forming therein a low-temperature domain and housing a superconducting coil, a heat shield covering the inner tank and forming therein a mid-temperature domain with a temperature higher than in the low-temperature domain, and an outer tank containing the heat shield so as to separate the heat shield from the ambient air and forming a normal-temperature domain with a temperature higher than in the mid-temperature domain;

a current lead connected at one end to the superconducting coil, and connected at the other end to a lead line leading to an external excitation power source provided outside the vacuum container;

a switch to be turned on and off in order to shunt or open both ends of the superconducting coil; and a switching device that turns on and off the switch, the superconducting apparatus being switched to a persistent current mode by supplying an electric current to the superconducting coil from the external excitation power source through the current lead under a condition that the switch is off, thereby causing the superconducting coil to generate a necessary magnetic field, arid then shunting both ends of the superconducting coil by turning on the switch, wherein the current lead includes a first current lead connected at one end to one end of the superconducting coil in the low-temperature domain and a second current lead connected at one end to the other end of the first current lead in the mid-temperature domain and connected at the other end to the lead line in the normal-temperature domain, at least the first current lead including the superconducting current lead which becomes a superconducting state in the mid-temperature domain, and wherein the switch includes a thermal superconducting switch connected to the both ends of the superconducting coil to shunt the superconducting coil in the low-temperature domain and a mechanical switch connected to the both ends of the first current lead in parallel to the thermal superconducting switch and able to shunt the superconducting coil in the mid-temperature domain, the mechanical switch being turned on and off through a driving mechanism disposed in the mid-temperature domain and driven by the switching device.

2. The superconducting magnet apparatus as set forth in claim 1, wherein the mechanical switch is a normal conducting switch composed of a normal conducting material.

3. The superconducting magnet apparatus as set forth in claim 1, wherein the switching device turns on the mechanical switch at the start of switching into the persistent current mode and turns off the mechanical switch when the thermal superconducting switch becomes a specified superconducting state.

4. The superconducting magnet apparatus as set forth in claim 2, wherein the switching device turns on the mechanical switch at the start of switching into the persistent current mode and turns off the mechanical switch when the thermal superconducting switch becomes a specified superconducting state.

5. The superconducting magnet apparatus as set forth in one of claims 1–3 or 4, wherein the driving mechanism includes a mechanism using a normal conducting solenoid generating electromagnetic force by the interaction with the magnetic field generated by the superconducting coil, and turns on and off the mechanical switch by closing or opening the contact of the mechanical switch by the electromagnetic force.

6. The superconducting magnet apparatus as set forth in one of claims 1–3 or 4, wherein the driving mechanism includes a mechanism using a piezoelectric element, and turns on and off the mechanical switch by closing or opening the contact of the mechanical switch by energizing or de-energizing the piezoelectric element.

7. The superconducting magnet apparatus as set forth in claim 6, wherein the driving mechanism is a slide mechanism using an ultrasonic motor including the piezoelectric element.

* * * * *